(12) United States Patent
Lee et al.

(10) Patent No.: US 7,682,969 B2
(45) Date of Patent: Mar. 23, 2010

(54) METHOD OF FABRICATING SEMICONDUCTOR DEVICE

(75) Inventors: Kyeong-Sik Lee, Gangnam-gu (KR); Joog-Guk Kim, Gangnam-gu (KR)

(73) Assignee: Dongbu HiTek Ltd., Co., Seoul (KR)

( * ) Notice: Subject to any disclaimer, the term of this patent is extended or adjusted under 35 U.S.C. 154(b) by 0 days.

(21) Appl. No.: 12/170,261

(22) Filed: Jul. 9, 2008

(65) Prior Publication Data
US 2009/0017618 A1 Jan. 15, 2009

(30) Foreign Application Priority Data
Jul. 12, 2007 (KR) .................. 10-2007-0070037

(51) Int. Cl.
*H01L 21/44* (2006.01)
(52) U.S. Cl. .................. 438/660; 257/E21.169
(58) Field of Classification Search .................. 438/660; 257/E21.169
See application file for complete search history.

(56) References Cited

U.S. PATENT DOCUMENTS

| | | | |
|---|---|---|---|
| 5,300,307 A * | 4/1994 | Frear et al. .................. 148/518 |
| 6,140,236 A * | 10/2000 | Restaino et al. .................. 438/687 |
| 6,372,645 B1 * | 4/2002 | Liu et al. .................. 438/688 |
| 6,440,841 B2 * | 8/2002 | Wang et al. .................. 438/629 |
| 6,468,908 B1 * | 10/2002 | Chen et al. .................. 438/687 |
| 6,774,035 B2 * | 8/2004 | Farrar et al. .................. 438/660 |
| 6,977,221 B2 * | 12/2005 | Sandhu et al. .................. 438/664 |
| 7,037,836 B2 * | 5/2006 | Lee .................. 438/687 |
| 2001/0053596 A1 * | 12/2001 | Wang et al. .................. 438/597 |

FOREIGN PATENT DOCUMENTS

KR    10-2002-0063815    8/2002

* cited by examiner

*Primary Examiner*—Charles D Garber
*Assistant Examiner*—Stanetta D Isaac
(74) *Attorney, Agent, or Firm*—Sherr & Vaughn PLLC

(57) ABSTRACT

A method of forming a semiconductor device that includes heating a wafer on which an Al—Cu sputtering thin film is formed before patterning the Al—Cu sputtering thin film. The heating is performed at a temperature no less than a solid solution temperature of copper or at a temperature between 300° C. and 600° C. The process temperature in heating the process wafer is not higher than the flow temperature of aluminum or is the temperature at which a reflow process can be performed.

20 Claims, 2 Drawing Sheets

METHOD OF FABRICATING SEMICONDUCTOR DEVICE

The present application claims priority under 35 U.S.C. §119 to Korean Patent Application No. 10-2007-000070037 (filed on Jul. 12, 2007), which is hereby incorporated by reference in its entirety.

BACKGROUND

In fabricating a semiconductor device, the width of a metal wiring line may be reduced as the element of the semiconductor device becomes highly integrated. In order to increase the conductivity of the wiring line, a material such as copper (Cu) may be used. However, it is sometimes difficult to form copper using a present patterning process. Therefore, in many cases, a wiring line process of depositing aluminum by sputtering to perform patterning may be used. In order to increase the conductivity of the wiring line, copper can be partially included in the aluminum. When a target obtained by including copper from about 0.1% to about 0.5% in aluminum may be used in a sputtering process, a patterning process can be performed in the above containing amount of copper. The sputtering can be performed at a temperature between a range of 120° C. and 200° C., which is lower than in another layer deposition process such as chemical vapor deposition (CVD). When an Al—Cu sputtering deposition layer is left at a relatively low temperature for a long time, an Al—Cu thin film changes from a GP zone to a θ phase due to an aging effect so that the copper component in the Al—Cu thin film is extracted in the form of a particle. The copper extracted material may serve as an etching stop layer that prevents aluminum positioned under the particle from being etched when the Al—Cu thin film is reactive ion etched to form process defect in the form of a micro bridge between metal lines.

Figure 1:
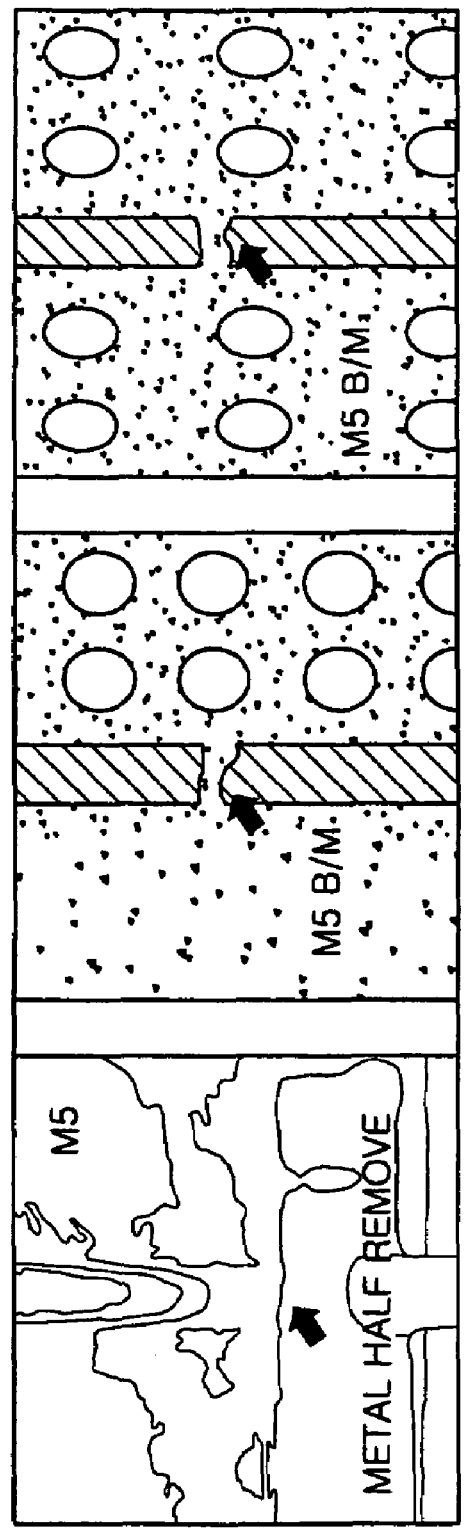

As illustrated in example FIG. 1, an enlarged side section and plane of a photograph is shown of a process defect in the form of a micro bridge caused by extracting copper in an Al—Cu sputtering thin film. As a result, since the defect deteriorates the function of the semiconductor device and reliability, when the defect is generated, a large number of process wafers are scraped. When process yield deteriorates due to an increase in a reject ratio, process cost and chip production cost increase.

SUMMARY

Embodiments relate to a method of forming a wiring line by aluminum partially including copper.

Embodiments relate to a method of forming a semiconductor device in order to solve problems caused by extracting copper when an Al—Cu sputtering layer is left in a sputtering process environment for a long time.

In accordance with embodiments, a method of forming a semiconductor device may include at least one of the following steps: heating a wafer on which an Al—Cu sputtering thin film is formed at a temperature no less than a solid solution temperature for copper in an Al thin film before patterning the Al—Cu sputtering thin film.

In accordance with embodiments, a method of forming a semiconductor device may include at least one of the following steps: forming a process wafer on which an Al—Cu thin film serving as a wiring line layer is at least partially laminated by sputtering; and then leaving the process wafer in a sputtering chamber at a process temperature; and then completely laminating the wiring line layer on the process wafer; and then heating the process wafer on which the wiring line layer is completely laminated at a set temperature; and then patterning the wiring line layer.

In accordance with embodiments, when the process temperature in heating the process wafer is higher than 500° C., since problems can be caused by the flow of the formed Al thin film, the process temperature is not preferably higher than the flow temperature of the Al thin film even when the process time is short. In addition, the process temperature can be determined in consideration of the phase of a solid solution. However, when the reflow process is performed after forming the wiring line layer on the wafer where a contact hole is formed, heating the process wafer can be further provided together with the reflow process.

Although all of the extracted copper is not in a solid phase, a certain amount of effect can be expected by reducing particles or the size of the particles. Therefore, the thin film can be processed for a short time at the process temperature. In accordance with embodiments, a difference in the solid solution temperature can be generated by the density of Al—Cu. However, the effect of heating the process wafer can be obtained when the amount of copper is within 3% and when the process wafer is heated at the temperature no less than 300° C. In accordance with embodiments, the time for which the Al—Cu thin film is left at the process temperature of the sputtering chamber can be determined in accordance with the degree of the process and needs not be limited. In accordance with embodiments, when copper is segregated in the wiring line forming process due to the aging effect, the extracted copper is turned to a solid solved through simple thermal treatment. Therefore, it is possible to prevent the extracted copper from prohibiting the etching of a pattern in the patterning process so that it is possible to prevent the formation of the pattern from being deteriorated. In accordance with embodiments, it is possible to reduce the reject ratio in the wiring line process. The thermal treatment may be previously performed on the left process wafer so that it is possible to rework problems caused by leaving the process wafer in the process chamber and to improve yield.

DRAWINGS

Example FIG. 1 illustrates the enlarged side section and plane of a photograph of process defect in the form of a micro bridge that is caused by extracting Cu in an Al—Cu sputtering thin film.

Figure 2:
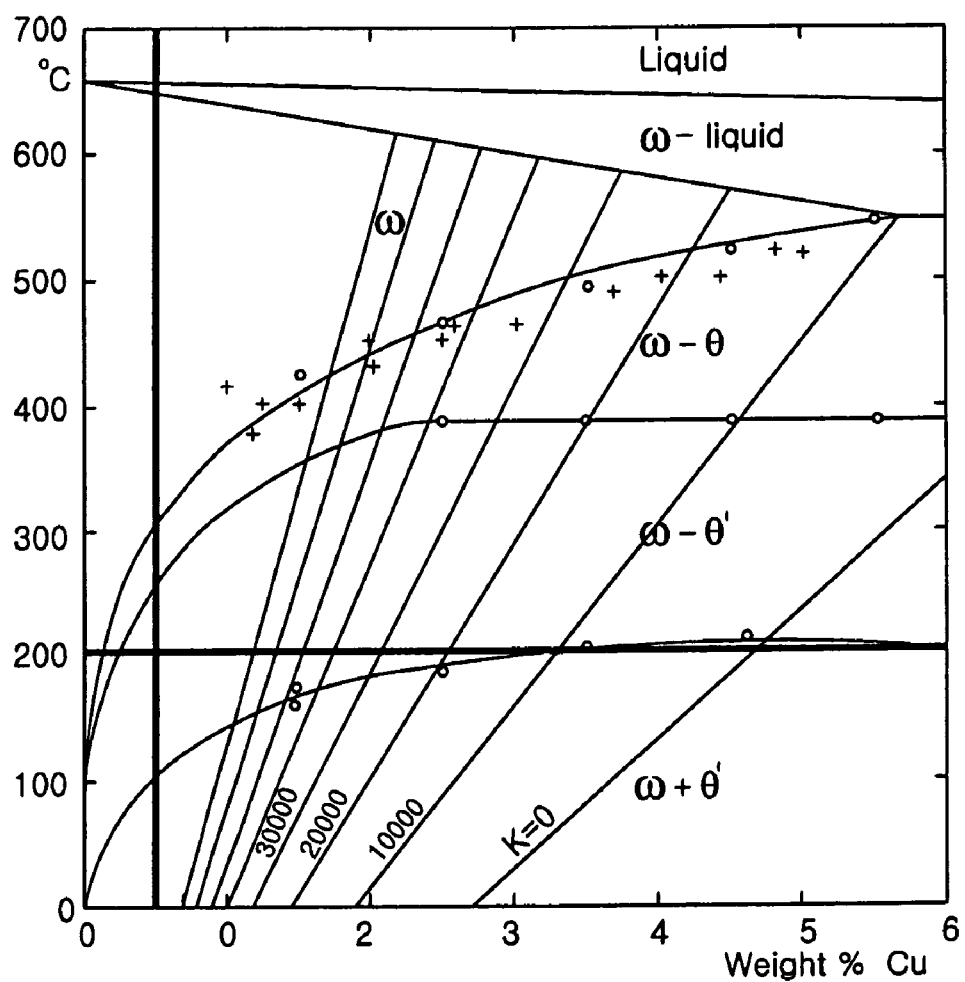

Example FIG. 2 is a graph illustrating a state in which copper is solidified in accordance with the temperature of aluminum, in accordance with embodiments.

DESCRIPTION

Hereinafter, embodiments of the present invention will be described in detail with reference to the accompanying drawings so that they can be readily implemented by those skilled in the art.

In accordance with embodiments, Al—Cu or Ti/TiN laminated on and/or over Al—Cu used as a reflection preventing layer may be left in a deposition chamber in an Al deposition process performed by sputtering at a process chamber temperature between a range of 120° C. and 200° C. so that an aging effect is generated.

After depositing a liner titanium (Ti) or Ti/TiN (a bottom layer) in order to form a wiring line, the Al—Cu and the Ti/TiN used as the reflection preventing layer may be sequentially deposited by sputtering. However, when the deposition of the Al—Cu or the Ti/TiN thin film is stopped due to errors generated in the semiconductor device during the above-described processes, after depositing the target thickness of remaining deposition layers, the deposition process may be stopped.

After forming a wiring line layer on an impact wafer, the wafer is positioned in a process chamber that can heat the wafer to a temperature no less than 300° C. It may be generally difficult to heat a sputtering device to a temperature no less than 300° C. Since the sputtering device is a vacuum device, in terms of efficiency, processes of heating the wafer in a sputtering chamber may be performed in another device. In the process chamber, thermal treatment may be performed at an annealing temperature between a range of 300° C. and 600° C. for a time in a range between 100 to 300 seconds. The heated wafer is then cooled at room temperature. When the wafer is too slowly cooled, copper can be extracted again. However, the re-extraction of copper does not matter when the wafer is cooled at room temperature. Then, a wiring line patterning process may be performed simultaneously with the other normal wafers (i.e., the wafers that are not left in the sputtering chamber). Meaning, the wiring line layer may be coated with photoresist and exposed and developed to form an etching mask pattern. The wiring line layer may then be etched using the etching mask pattern. The etching can be performed by a reactive ion etching (RIE) method that can improve etching efficiency. Since the temperature and time of the thermal treatment can affect each other to a certain degree, the temperature and time can be determined in consideration of each other. For example, when the thermal treatment is performed at a high temperature, i.e., no less than 600° C., the process time may be reduced. On the other hand, when the thermal treatment is performed at a relatively low temperature of 300° C., the thermal treatment can be performed for several minutes so that extracted copper can sufficiently change to a solid phase.

As illustrated in example FIG. 2, a graph illustrating a state in which copper is in a solid phase in accordance with the temperature of aluminum. When the thermal treatment is performed at a temperature no less than 300° C., a copper extracted material is not found and a bridge or a lock-in phenomenon is not found between wiring lines obtained by patterning.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
    forming a partially laminated metal film as a wiring line layer on a wafer; and then
    heating the wafer including the wiring line layer in a sputtering chamber at a first predetermined temperature after forming the wiring line layer; and then
    performing a process which completely laminates the wiring line layer on the wafer; and then
    heating the wafer and the wiring line layer at a second predetermined temperature after completely laminating the wiring line layer on the wafer; and then
    patterning the completely laminated wiring line layer.

2. The method of claim 1, wherein the metal film comprises an aluminum-copper film and the second predetermined temperature is not lower than a solid solution temperature for a copper component in the aluminum-copper film.

3. The method of claim 2, wherein the aluminum-copper film includes copper at 0.5%.

4. The method of claim 3, wherein the first predetermined temperature is less than 300° C.

5. The method of claim 4, wherein the second predetermined temperature is in a range between 300° C. and 600° C.

6. The method of claim 5, wherein the second predetermined temperature is not greater than a reflow temperature of aluminum.

7. The method of claim 1, wherein heating the wafer the second time is simultaneously performed with reflowing an aluminum film.

8. The method of claim 1, wherein the metal wiring layer on the wafer is formed by a sputtering process.

9. The method of claim 1, wherein the heating at the second temperature is performed for 100 to 300 seconds.

10. A method comprising:
    forming a partially laminated metal wiring line layer on a wafer; and then
    performing a first heating process on the wafer and the partially laminated metal wiring line layer; and then
    performing a process which completely laminates the metal wiring line layer on the wafer; and then
    performing a second heating process on the wafer and the completely laminated metal wiring line layer; and then
    performing a cooling process on the wafer after performing the second heating process; and then
    patterning the metal wiring line after performing the cooling process.

11. The method of claim 10, wherein the metal wiring line comprises an aluminum-copper film and the second heating process is performed at a temperature not lower than a solid solution temperature for a copper component in the aluminum-copper film.

12. The method of claim 11, wherein the aluminum-copper film includes copper at 0.5%.

13. The method of claim 12, wherein the first heating process is performed at temperature less than 300° C.

14. The method of claim 13, wherein the second heating process is performed at a temperature in a range between 300° C. and 600° C.

15. The method of claim 14, wherein the second heating process is performed for 100 to 300 seconds.

16. The method of claim 10, wherein the cooling process is performed at room temperature.

17. The method of claim 10, wherein the metal wiring line is formed by a sputtering process.

18. The method of claim 17, wherein the sputtering process is performed at a temperature between a range of 120° C. and 200° C.

19. A method comprising:
    partially laminating an aluminum-copper wiring layer on a wafer; and then
    performing a first heating process on the wafer and the partially laminated aluminum-copper wiring; and then
    completely laminating the aluminum-copper wiring layer on the wafer; and then
    performing a second heating process on the wafer at a temperature not lower than a solid solution temperature for a copper component in the aluminum-copper wiring layer while simultaneously reflowing an aluminum component in the completely laminated aluminum-copper wiring; and then
    performing a cooling process on the wafer after performing the second heating process; and then
    patterning the aluminum-copper wiring after performing the cooling process.

20. The method of claim 19, wherein the second heating process is performed at a temperature not lower than a reflow temperature of aluminum.

* * * * *